US008742417B2

(12) United States Patent
Kang et al.

(10) Patent No.: US 8,742,417 B2
(45) Date of Patent: Jun. 3, 2014

(54) THIN FILM TRANSISTOR ARRAY PANEL AND MANUFACTURING METHOD OF THE SAME

(75) Inventors: Yoon Ho Kang, Yongin-si (KR); Sang-Uk Lim, Cheonan-si (KR); Young-Soo Yoon, Anyang-si (KR); Woo Sub Shim, Asan-si (KR)

(73) Assignee: Samsung Display Co., Ltd. (KR)

( * ) Notice: Subject to any disclaimer, the term of this patent is extended or adjusted under 35 U.S.C. 154(b) by 176 days.

(21) Appl. No.: 13/353,264

(22) Filed: Jan. 18, 2012

(65) Prior Publication Data

US 2012/0248444 A1    Oct. 4, 2012

(30) Foreign Application Priority Data

Apr. 4, 2011    (KR) .................. 10-2011-0030687

(51) Int. Cl.
H01L 29/04    (2006.01)
H01L 29/10    (2006.01)
H01L 31/00    (2006.01)

(52) U.S. Cl.
USPC .............. 257/59; 257/E29.273; 257/E33.053; 438/30; 349/62

(58) Field of Classification Search
None
See application file for complete search history.

(56) References Cited

U.S. PATENT DOCUMENTS

| 2006/0012735 | A1* | 1/2006 | Yamada et al. ............... 349/110 |
| 2010/0085523 | A1* | 4/2010 | Terashita et al. ............. 349/123 |
| 2010/0123137 | A1* | 5/2010 | Yang et al. ...................... 257/59 |
| 2011/0085103 | A1* | 4/2011 | Yang et al. ...................... 349/43 |

OTHER PUBLICATIONS

WO 2008/123340 English translated abstract.*

* cited by examiner

*Primary Examiner* — Sonya D McCall Shepard
(74) *Attorney, Agent, or Firm* — Innovation Counsel LLP

(57) ABSTRACT

According to this disclosure of a thin film transistor array panel and the manufacturing method thereof, dams have a function of forming a light blocking member by an inkjet printing method and are formed along with color filters. Spacers are formed by the inkjet printing method along with the light blocking member and color filters. Advantages of this panel and its manufacturing method are a reduction in an alignment error of the light blocking member and the color filters, reduced manufacturing cost, and a simplified manufacturing.

36 Claims, 19 Drawing Sheets

FIG.6
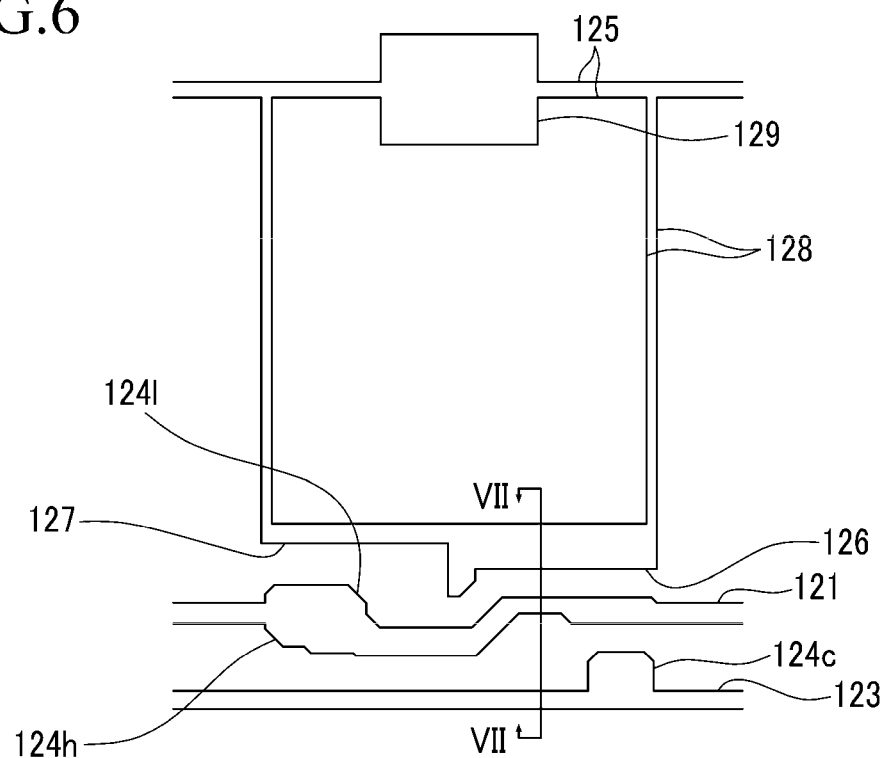
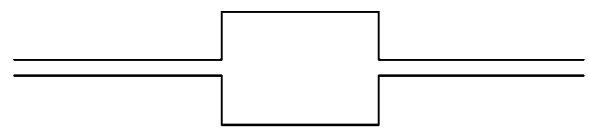

THIN FILM TRANSISTOR ARRAY PANEL AND MANUFACTURING METHOD OF THE SAME

CROSS-REFERENCE TO RELATED APPLICATION

This application claims priority to and the benefit of Korean Patent Application No. 10-2011-0030687 filed in the Korean Intellectual Property Office on Apr. 4, 2011, the entire contents of which are incorporated herein by reference.

BACKGROUND OF THE INVENTION (a) Field of the Invention

The present disclosure relates to a thin film transistor array panel and a manufacturing method thereof.

(b) Description of the Related Art

A liquid crystal display (LCD) is currently one of the most commonly used flat panel displays. The LCD includes two substrates, each with electrodes formed thereon, and a liquid crystal layer interposed between the two substrates. In the LCD, a voltage is applied to the electrodes to align liquid crystal molecules of the liquid crystal layer to thereby regulate the transmittance of polarized light passing through the liquid crystal layer.

Among the LCD families, an LCD having a structure in which field generating electrodes are respectively formed on two display panels is widely used. Of the two display panels, a plurality of pixel electrodes and thin film transistors are arranged in a matrix format on a first display panel (hereinafter referred to as "a thin film transistor array panel"), color filters of red, green, and blue are formed on the second display panel, and one common electrode covers the entire surface of the second display panel (hereinafter referred to as "a common electrode panel").

Since the pixel electrodes and the corresponding color filters are formed on different display panels, however, it is difficult to precisely align each pixel electrode with each color filter, so an alignment error may occur.

A color filter-on-array (CoA) structure, in which the color filter and the pixel electrode are formed on the same display panel has been proposed. In addition to the color filter, a light blocking member is generally formed on the same display panel as the pixel electrode in this structure.

When this CoA structure is employed, however, because of the alignment error between the color filter and the light blocking member, the color filter or the light blocking member may be higher or lower than the specified height. Because of the height difference between the color filter and the light blocking member, a cell path length of the liquid crystal display may not be constant, possibly causing irregular movement of the liquid crystal molecules, such that the image quality may decline.

Also, when forming a plurality of thin films on one display panel, a plurality of photolithography processes using a plurality of photomasks are required. This drives up manufacturing costs and complicates the manufacturing process.

The above information disclosed in this Background section is only for enhancement of understanding of the background of the invention. It may therefore contain information that does not form prior art that is already known in this country to a person of ordinary skill in the art.

SUMMARY OF THE INVENTION

The present disclosure provides a thin film transistor array panel with a decreased manufacturing cost and a simplified manufacturing method, and that prevents an alignment error by forming a light blocking member at a desired position through a simple method.

A thin film transistor array panel according to an exemplary embodiment includes: an insulating substrate; a plurality of thin film transistors disposed on the insulating substrate; a plurality of color filters and a plurality of dams disposed on the insulating substrate; and a light blocking member formed by an inkjet printing method and disposed in a region enclosed by the plurality of color filters and a plurality of dams, wherein the plurality of dams expose at least a portion of a plurality of thin film transistors.

A colored member disposed in the region enclosed by a plurality of dams may be further included.

A spacer made with the same layer as the colored member may be further included.

The colored member and the spacer may be formed by the inkjet printing method.

The colored member may be formed by the inkjet printing method using the dams as partitions.

The thin film transistor array panel may include a display area formed with a plurality of pixels and a peripheral area around the display area, and an additional dam disposed in the peripheral area may be further included.

The plurality of dams may be formed with the same layer as at least one of the plurality of color filters.

The plurality of dams may include fluorine-based or silicone-based additives.

The additives may include one of 1H,1H,2H,2H-Perfluorooctyltriethoxysilane, perfluoropentanoic acid, perfluorotetradecanoic acid, perfluorotridecanoic acid, perfluoroundecanoic acid, pefluorooctanoic acid, 1H,1H,2H,2H-perfluoro-1-octanol, perfluorononanoic acid, perfluoroheptanoic acid, 1H,1H,2H,2H-perfluorodecyltriethoxysilane, perfluoroglutaric acid, 1H,1H,2H,2H-perfluoro-1-decanol, and perfluorodecanoic acid.

The plurality of dams may further include a pigment dispersion agent, a monomer, a binder, and an initiator.

A height due to the plurality of color filters and the plurality of dams may be about 1 μm to about 3 μm.

The height due to the plurality of color filters and the plurality of dams may be about 2 μm to about 2.5 μm.

The light blocking member may include a pigment dispersion agent and a solvent material, and the solvent material may have a boiling point of more than about 200 degrees.

The solvent material may include one of ethylene glycol n-butyletheracetate (EGBEA), dipropylene glycol monomethylether acetate (DPMA), propylene glycol diacetate (PGDA), diethylene glycol monoethylether (DPGME), and diethylene glycol monoethylether (carbitol).

The light blocking member may further include a binder, and the binder may be acrylate-based.

The binder may be represented by a chemical formula

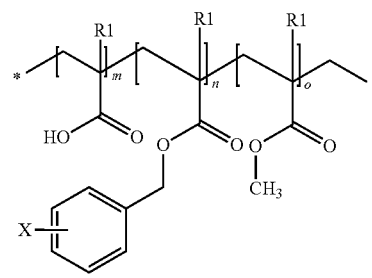

Here, m, n, and o are integers of 0-10,000, R1 is H or CH3, and X is hydrogen, an alkyl, an alkoxy, a nitro, or a halogen.

A line width of the light blocking member may be in the range of about 3 μm to about 10 μm, and more preferably in the range of about 4 μm to about 5 μm.

A manufacturing method of a thin film transistor array panel according to an exemplary embodiment includes: forming a plurality of thin film transistors on an insulating substrate; forming a plurality of color filters and a plurality of dams on the insulating substrate; and forming a light blocking member through an inkjet printing method in a region enclosed by the plurality of color filters and the plurality of dams, wherein at least a portion of the thin film transistors lay outside the region enclosed by the color filters and the dams.

The method may further include forming a colored member in the region enclosed by the plurality of dams.

The method may further include forming a spacer made with the same layer as the colored member in forming of the colored member.

The colored member and the spacer may be formed by an inkjet printing method.

The colored member may be formed by the inkjet printing method using the dams as partitions.

The thin film transistor array panel may include a display area formed with a plurality of pixels and a peripheral area around the display area, and the dams disposed in the peripheral area may be formed in forming of the plurality of color filters and the plurality of dams.

The plurality of dams may be formed with the same layer as at least one of the plurality of color filters.

The plurality of dams may include fluorine-based or silicone-based additives.

Ink for inkjet printing in forming of the light blocking member may include a pigment dispersion agent and a solvent material, and the solvent material may have a boiling point of more than about 200 degrees.

According to an exemplary embodiment, the dams for the light blocking member are formed along with the color filters, the light blocking member is formed by the inkjet method using the color filters and the dams as partitions, and the colored member and the cell spacer are simultaneously formed by the inkjet method, and thereby the alignment error of the light blocking member and the color filter may be reduced, the manufacturing cost is low, and the manufacturing method is simplified.

BRIEF DESCRIPTION OF THE DRAWINGS

FIG. 6, FIG. 8, FIG. 10, and FIG. 13 are layout views sequentially showing a manufacturing method of a thin film transistor array panel according to an exemplary embodiment.

DETAILED DESCRIPTION OF THE EMBODIMENTS

Figure 1:
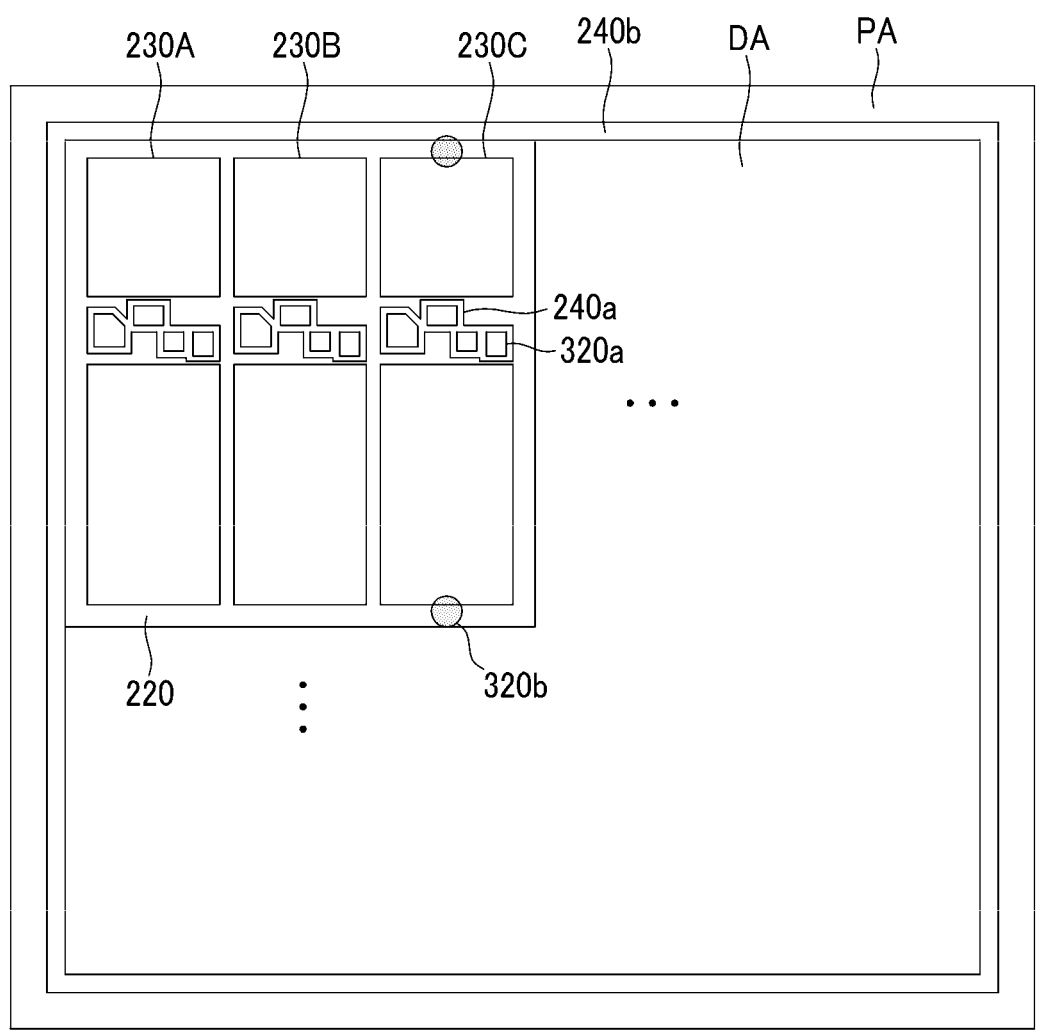
FIG. 1 is a schematic view of a liquid crystal display according to an exemplary embodiment of the present disclosure.

The present disclosure will be detailed more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a liquid crystal display according to an exemplary embodiment, will be described with reference to FIG. 1.

FIG. 1 is a schematic view of a liquid crystal display according to an exemplary embodiment.

Referring to FIG. 1, a liquid crystal display according to an exemplary embodiment, includes a display area DA and a peripheral area PA therearound.

A plurality of pixels include a plurality of color filters 230A, 230B, and 230C.

First dams 240a are formed in each pixel, and a second dam 240b is formed around the display area DA. The first dams 240a and the second dam 240b may be made with the same material as at least one of the plurality of color filters 230A, 230B, and 230C.

A light blocking member 220 is formed in a region enclosed by the first dams 240a and the second dam 240b, and outside the plurality of color filters 230A, 230B, and 230C.

Also, a colored member 320a is formed in the region enclosed by the first dams 240a formed in each pixel.

A cell spacer 320b is formed on at least a portion of the plurality of pixels.

The colored member 320a and the cell spacer 320b may be formed together with the same layer.

Figure 2:
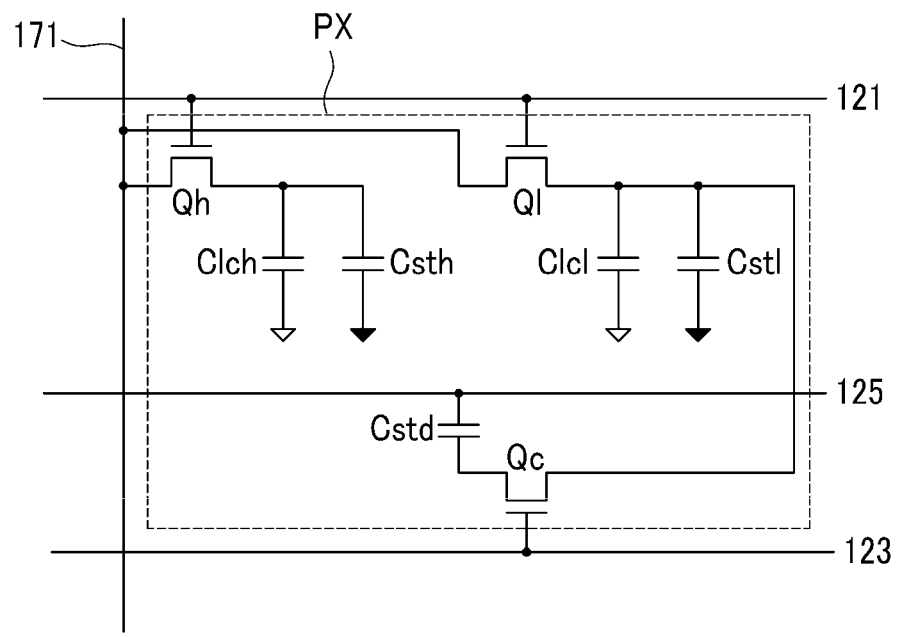
FIG. 2 is an equivalent circuit diagram of a pixel of a liquid crystal display according to an exemplary embodiment of the present disclosure.
Figure 3:
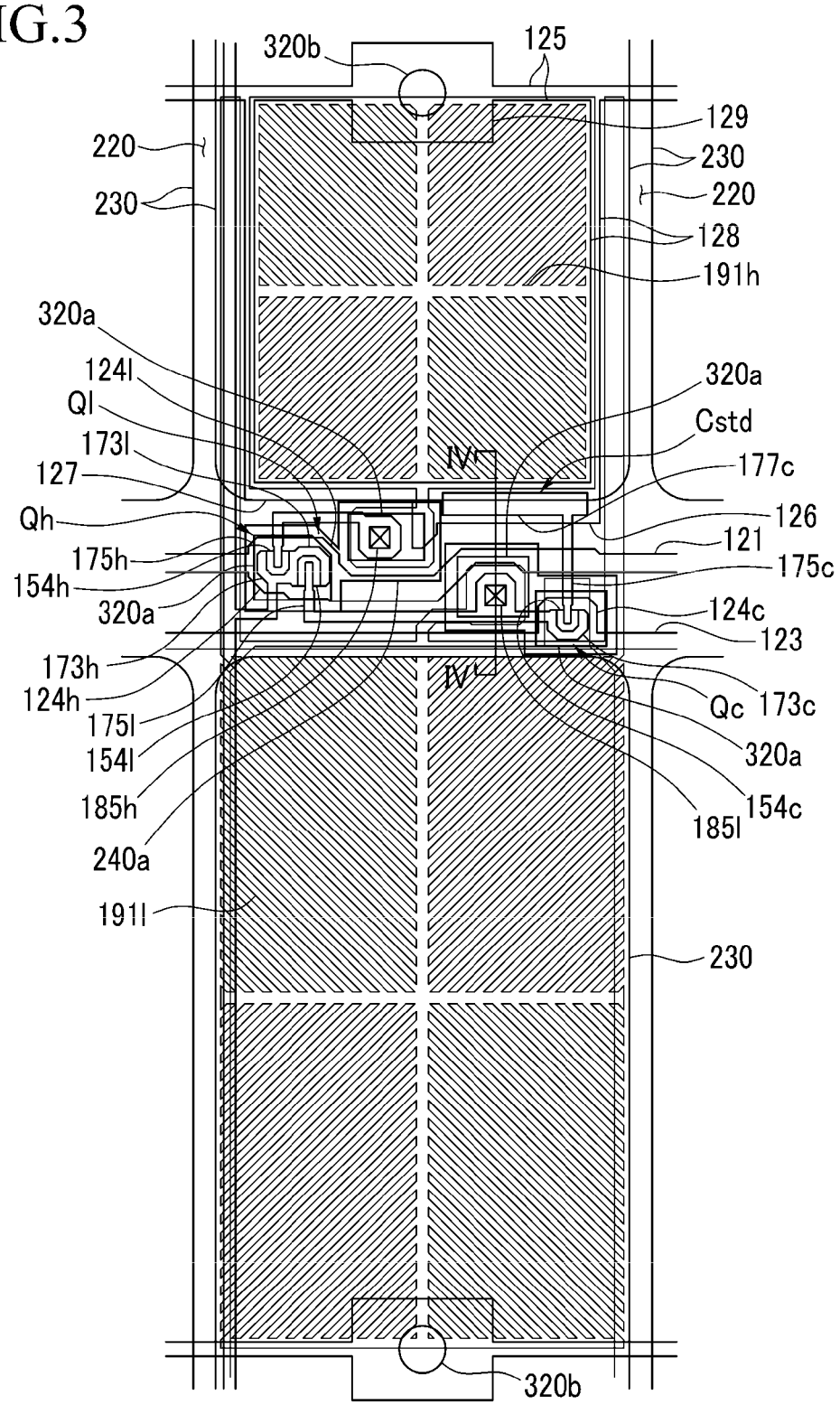
FIG. 3 is a layout view of a liquid crystal display including a thin film transistor array panel according to an exemplary embodiment.
Figure 4:
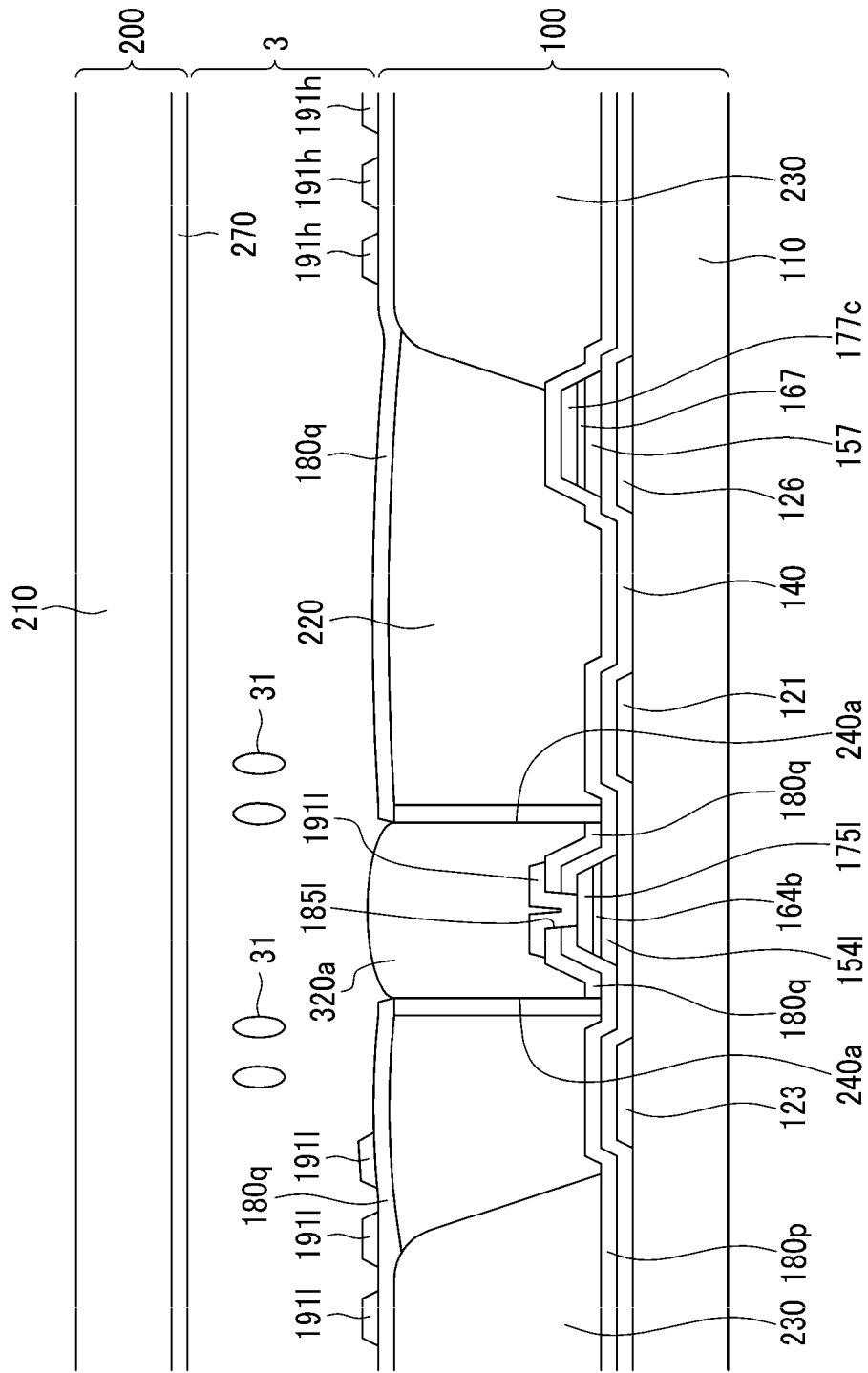
FIG. 4 is a cross-sectional view of the liquid crystal display shown in FIG. 3 taken along the line IV-IV.
Figure 5:
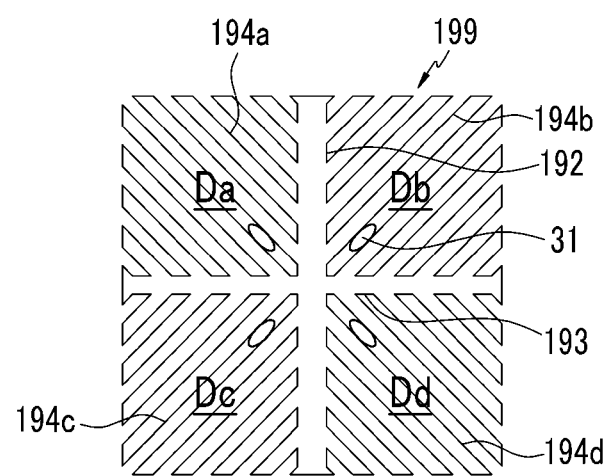
FIG. 5 is a layout view showing a pixel electrode of the thin film transistor array panel shown in FIG. 3.

Now, a liquid crystal display including a thin film transistor array panel according to an exemplary embodiment will be described with reference to FIG. 2 to FIG. 5. FIG. 2 is an equivalent circuit diagram of a pixel of a liquid crystal display according to an exemplary embodiment. FIG. 3 is a layout view of a liquid crystal display including a thin film transistor array panel according to an exemplary embodiment. FIG. 4 is a cross-sectional view of the liquid crystal display shown in FIG. 3 taken along the line IV-IV. FIG. 5 is a layout view showing a pixel electrode of the thin film transistor array panel shown in FIG. 3.

Referring to FIG. 2, the liquid crystal display according to an exemplary embodiment includes signal lines including a gate line 121, a storage electrode line 125, a step-down gate line 123, and a data line 171, and a pixel PX connected thereto.

The pixel PX includes first, second, and third switching elements Qh, Ql, and Qc, first and second liquid crystal capacitors Clch and Clcl, first and second storage capacitors Csth and Cstl, and a step-down capacitor Cstd. Here, the first switching element Qh and the first thin film transistor Qh, the second switching element Ql and the second thin film transistor Ql, and the third switching element Qc and the third thin film transistor Qc are denoted by the same reference numerals.

The first and second switching transistors Qh and Ql are respectively connected to the gate line 121 and the data line 171, and the third switching transistor Qc is connected to the step-down gate line 123.

The first and second switching transistors Qh and Ql as three terminal elements provided in the lower panel 100 have a control terminal connected to the gate line 121, an input terminal connected to the data line 171, and an output terminal connected to the first and second liquid crystal capacitors Clch and Clcl, and the first and second storage capacitors Csth and Cstl.

The third switching transistor Qc as a three-terminal element provided in a lower panel 100 has a control terminal connected to the step-down gate line 123, an input terminal connected to the second liquid crystal capacitor Clcl, and an output terminal connected to the step-down capacitor Cstd.

The first and second liquid crystal capacitors Clch and Clcl are formed by overlapping first and second subpixel electrodes 191h and 191l connected to the first and second switching elements Qh and Ql, and a common electrode 270 of the upper panel 200. The first and second storage capacitors Csth and Cstl are formed by overlapping the storage electrode line 125 as well as a storage electrode 129 and the first and second subpixel electrodes 191h and 191l.

The step-down capacitor Cstd is connected to the output terminal of the third switching transistor Qc and the storage electrode line 125, and the storage electrode line 125 provided in the lower panel 100 and the output terminal of the third switching transistor Qc overlap each other via an insulator.

Next, the liquid crystal display shown in FIG. 2 will be described with reference to FIG. 3 to FIG. 5 in detail.

A liquid crystal display according to the present exemplary embodiment includes the lower panel 100 and an upper panel 200 facing each other, a liquid crystal layer 3 interposed between the two display panels 100 and 200, and a pair of polarizers (not shown) attached at the outer surfaces of the display panels 100 and 200.

Now, the lower panel 100 will be described.

A plurality of gate conductors including a plurality of gate lines 121, a plurality of step-down gate lines 123, and a plurality of storage electrode lines 125 are formed on an insulating substrate 110.

The gate lines 121 and the step-down gate lines 123 transfer gate signals and mainly extend in a transverse direction. Each gate line 121 includes a first gate electrode 124h and a second gate electrode 124l protruding upward and downward, and each step-down gate line 123 includes a third gate electrode 124c protruding upward. The first gate electrode 124h and the second gate electrode 124l are connected to each other, thereby forming one protrusion.

The storage electrode lines 125 mainly extend in the transverse direction and transfer a predetermined voltage such as a common voltage Vcom. The storage electrode line 125 includes a storage electrode 129 protruding upward and downward, a pair of longitudinal portions 128 extending almost perpendicularly to the gate line 121 downward, and a transverse portion 127 connecting the ends of a pair of longitudinal portions 128 to each other. The transverse portion 127 includes a storage expansion electrode 126 extended downward, as shown in FIG. 3.

A gate insulating layer 140 is formed on the gate conductors 121, 123, and 125.

A plurality of semiconductor stripes 151 made of hydrogenated amorphous silicon (a-Si), polysilicon, or equivalents are formed on the gate insulating layer 140. The semiconductor stripes 151 are mainly extended in the vertical direction, and each semiconductor stripe 151 includes first and second semiconductors 154h and 154l extending toward the first and second gate electrodes 124h and 124l and connected to each other, and a third semiconductor 154c connected to the second semiconductor 154l. The third semiconductor 154c is extended, thereby forming a fourth semiconductor 157.

A plurality of ohmic contact stripes (not shown) are formed on the semiconductor stripes 151, first ohmic contacts (not shown) are formed on the first semiconductor 154h, and a second ohmic contact 164b and a third ohmic contact (not shown) are also formed on the second semiconductor 154l and the third semiconductor 154c. The ohmic contact stripes include a first protrusion (not shown) forming a pair along with the first ohmic contact and disposed on the first protrusion of the semiconductor, a second protrusion (not shown) forming a pair along with the second ohmic contact and disposed on the second protrusion of the semiconductor, and a third protrusion (not shown) forming a pair along with the third ohmic contact and disposed on the third protrusion of the semiconductor. The third ohmic contact is extended, thereby forming a fourth ohmic contact 167.

A data conductor including a plurality of data lines 171, a plurality of first drain electrodes 175h, a plurality of second drain electrodes 175l, and a plurality of third drain electrodes 175c is formed on the ohmic contacts 164b and 167.

The data lines 171 transmit data signals and extend in the longitudinal direction thereby intersecting the gate lines 121 and the step-down gate lines 123. Each data line 171 includes a first source electrode 173h and a second source electrode 173l forming a "W" shape together and extending toward the first gate electrode 124h and the second gate electrode 124l.

The first drain electrode 175h, the second drain electrode 175l, and the third drain electrode 175c have one end portion having a wide area and the other end portion of a linear shape. The bar end portions of the first drain electrode 175h and the second drain electrode 175l are partially enclosed by the first source electrode 173h and the second source electrode 173l. The wide end portion of the second drain electrode 175l is further extended thereby forming the third source electrode 173c of a "U" shape. An expansion 177c of the third drain electrode 175c overlaps the storage expansion electrode 126 thereby forming a step-down capacitor Cstd, and the bar end portion is partially enclosed by the third source electrode 173c.

The first/second/third gate electrode 124h/124l/124c, the first/second/third source electrode 173h/173l/173c, and the first/second/third drain electrode 175h/175l/175c form the first/second/third thin film transistor (TFT) Qh/Ql/Qc along with the first/second/third semiconductor island 154h/154l/154c, and a channel of the thin film transistor is formed in the semiconductor 154h/154l/154c between the source electrode 173h/173l/173c and the drain electrode 175h/175l/175c.

Also, the semiconductor stripes 151 including the semiconductors 154h, 154l, and 154c except for the channel region between the source electrodes 173h, 173l, and 173c, and the drain electrodes 175h, 175l, and 175c have substantially the same shape as the data conductors 171, 175h, 175l, and 175c, and the underlying ohmic contacts 164b and 167.

That is, the semiconductor stripes 151 including the semiconductors 154h, 154l, and 154c have a portion that is exposed without being covered by the data conductors 171, 175h, 175l, and 175c, and a portion between the source electrodes 173h, 173l, and 173c and the drain electrodes 175h, 175l, and 175c.

A lower passivation layer 180p made of an inorganic insulator such as silicon nitride or silicon oxide is formed on the data conductors 171, 175h, 175l, 175c and the exposed semiconductors 154h, 154l, and 154c.

A plurality of color filters 230 and a plurality of dams 240a are formed on the lower passivation layer 180p. Each color filter 230 is formed in most of the region except for where the first thin film transistor Qh, the second thin film transistor Ql, and the third thin film transistor Qc are positioned. Each color filter 230 may display one of the primary colors, such as three primary color choices of red, green, and blue. Also, the dams 240a may be made with the same layer as at least one of the plurality of color filters 230. Also, in another exemplary embodiment, the dams 240a may be made with the same layer as a blue color filter 230 having relatively low chroma. Although not shown here, an additional dam may be formed around the display area, and the additional dam may have a shape enclosing the display area.

The dams 240a of the thin film transistor according to an exemplary embodiment are formed to expose the thin film transistors Qh/Ql/Qc such that the light blocking member 220 that will be described later is not formed on the thin film transistor. Accordingly, the portion enclosed by the dams 240a easily allows repair of a defect of the thin film transistor before being covered by the colored member 320a.

To simultaneously form the color filter 230 and the dams 240a, a material for the color filter 230 and the dams 240a further includes fluorine-based or silicone-based additives to increase an interfacial hydrophobic characteristic as well as an original color resist composition. In detail, the material for the color filter 230 and the dams 240a includes a pigment dispersion agent, a monomer, a binder, an initiator, and the additives. In the material for the color filter 230 and the dams 240a, the pigment dispersion agent may be in the range of about 30-90 wt %, and more preferably about 60-70 wt %; the monomer may be in the range of about 2-25 wt %, and more preferably about 5-10 wt %; the binder may be in the range of about 2-25 wt %, and more preferably about 5-10 wt %; the initiator may be in the range of about 0.01-1 wt %, and more preferably about 0.05-0.15 wt %; and the additives may be in the range of about 0.01-1 wt %, and more preferably about 0.1-1 wt %.

Examples of the additives may be 1H,1H,2H,2H-perfluorooctyltriethoxysilane, perfluoropentanoic acid, perfluorotetradecanoic acid, perfluorotridecanoic acid, perfluoroundecanoic acid, pefluorooctanoic acid, 1H,1H,2H,2H-perfluoro-1-octanol, perfluorononanoic acid, perfluoroheptanoic acid, 1H,1H,2H,2H-perfluorodecyltriethoxysilane, perfluoroglutaric acid, 1H,1H,2H,2H-perfluoro-1-decanol, and perfluorodecanoic acid.

The color filters 230 and the dams 240a function as a partition for ink for the light blocking member that will be described later to not overflow without a reduction of color reproducibility of the color filter 230, and may have a height of about 1-3 µm, or more preferably about 2-2.5 µm.

The light blocking member 220 is positioned in the region enclosed by each color filter 230 and the dams 240a. The light blocking member 220 is referred to as a black matrix, and prevents light leakage. The light blocking member 220 extends upward and downward according to the gate line 121 and the step-down gate line 123, includes a first light blocking member covering a region where the first thin film transistor Qh, the second thin film transistor Ql, and the third thin film transistor Qc are disposed, and a second light blocking member extending according to the data line 171.

The light blocking member 220 is formed through an inkjet printing method by using the color filters 230 and the dams 240a as partitions. The light blocking member 220 is formed by the inkjet printing method such that the ink for the light blocking member 220 must be easily discharged from a printing head of an inkjet printer. For this purpose, when forming the light blocking member 220 according to an exemplary embodiment, a black pigment dispersion agent is melted in a solvent having a boiling point of more than about 200 degrees. In detail, the solvent of the ink for the light blocking member 220 to form the light blocking member 220 may be ethylene glycol n-butyletheracetate (EGBEA), dipropylene glycol monomethyl etheracetate (DPMA), propylene glycol diacetate (PGDA), diethylene glycol monoethylether (DPGME), or diethylene glycol monoethylether (carbitol). Also, the ink for the light blocking member 220 includes the binder, and the light blocking member 220 of the thin film transistor according to an exemplary embodiment is formed through the inkjet printing method such that there is no problem such as a side taper angle, etc. Accordingly, the ink for the light blocking member 220 may include an acrylate-based binder. One example of the acrylate-based binder is as follows.

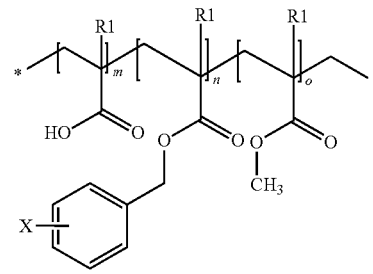

m, n, o: an integer of 0-10,000
R1: H, CH3
X: hydrogen, alkyl, alkoxy, nitro, halogen On the other hand, if a line width (a critical dimension) of the light blocking member 220 is very small, a drip amount of the ink for the light blocking member 220 is small such that accuracy may be deteriorated under the inkjet printing method. If the line width is very large, however, the aperture ratio of the liquid crystal display may be reduced. Accordingly, the line width of the light blocking member 220 of the thin film transistor array panel according to an exemplary embodiment may be in the range of about 3-10 µm, and more preferably about 4-5 µm, and thereby the aperture ratio of the display device may not be reduced while the accuracy is not reduced under the inkjet printing method.

An upper passivation layer 180q is formed on the color filter 230 and the light blocking member 220. The upper passivation layer 180q prevents peeling of the color filter 230 and light blocking member 220, and suppresses contamination of the liquid crystal layer 3 by the organic material of the solvent that flows in from the color filter 230, so that it prevents defects such as afterimages that may occur when an image is driven.

The lower passivation layer 180p and the upper passivation layer 180q have a plurality of first contact holes 185h and a plurality of second contact holes 185l exposing the wide end portion of the first drain electrode 175h and the wide end portion of the second drain electrode 175l.

A plurality of pixel electrodes 191 are formed on the upper passivation layer 180q.

With reference to FIG. 3, each pixel electrode 191 includes a first sub-pixel electrode 191h and a second sub-pixel electrode 191l that are separated from each other with two gate lines 121 and 123 therebetween and disposed above and beneath the pixel area with the center of the gate lines 121 and 123 to be adjacent in a column direction. The first sub-pixel electrode 191h and the second sub-pixel electrode 191l include one or more basic electrodes 199 or modifications thereof shown in FIG. 5.

Hereinafter, referring to FIG. 5, the basic electrode 199 will be described in detail.

As shown in FIG. 5, the entire shape of the basic electrode 199 is quadrangular, and it includes a cross-shaped stem portion that is formed of a transverse stem portion 193 and a vertical stem portion 192 that is perpendicular thereto. In addition, the basic electrode 199 is divided into a first subregion Da, a second subregion Db, a third subregion Dc, and a fourth subregion Dd by the transverse stem portion 193 and the vertical stem portion 192, and each subregion Da-Dd includes a plurality of first to fourth fine branched portions 194a, 194b, 194c, and 194d.

The first fine branch portion 194a extends obliquely in an upper left direction from the transverse stem portion 193 or the vertical stem portion 192, and the second fine branch portion 194b extends obliquely in an upper right direction from the transverse stem portion 193 or the vertical stem portion 192. In addition, the third fine branch portion 194c extends obliquely in a lower left direction from the transverse stem portion 193 or the vertical stem portion 192, and the fourth fine branch portion 194d extends obliquely in a lower right direction from the transverse stem portion 193 or the vertical stem portion 192.

The first to fourth fine branch portions 194a, 194b, 194c, and 194d form an angle of approximately 45 degrees or 135 degrees with the gate lines 121 or the transverse stem portion 193. Further, the fine branch portions 194a, 194b, 194c, and 194d of the adjacent subareas Da, Db, Dc, and Dd may be orthogonal to each other.

The widths of the fine branched portions 194a, 194b, 194c, and 194d may be in the range of 2.5 to 5.0 μm, and a gap between the adjacent fine branched portions 194a, 194b, 194c, and 194d in one subarea Da, Db, Dc, or Dd may be in the range of 2.5 to 5.0 μm.

According to another embodiment, the widths of the fine branched portions 194a, 194b, 194c, and 194d may be wider as the fine branched portions are closer to the transverse stem portion 193 or the vertical stem portion 192. Further, a difference between the widest portion and the narrowest portion in one fine branched portion 194a, 194b, 194c, or 194d may be in the range of 0.2 to 1.5 μm.

The first sub-pixel electrode 191h and the second sub-pixel electrode 191l include a circumference stem portion that surrounds the circumference thereof, and the vertical portion of the circumference stem portion extends along the data line 171 and may prevent capacitive coupling between the data line 171 and the first sub-pixel electrode 191h and second sub-pixel electrode 191l.

The first sub-pixel electrode 191h and the second sub-pixel electrode 191l receive a data voltage through the first contact hole 185h and the second contact hole 185l from the first drain electrode 175h and the second drain electrode 175l, respectively. The first sub-pixel electrode 191h and the second sub-pixel electrode 191l to which the data voltage is applied generates an electric field in conjunction with the common electrode 270 of the common electrode panel 200 to determine a direction of liquid crystal molecules 31 of the liquid crystal layer 3 between the two electrodes 191 and 270. As described above, according to the determined direction of the liquid crystal molecules, the transmittance of polarized light that passes through the liquid crystal layer 3 is changed.

The sides of the first to fourth fine branched portions 194a, 194b, 194c, and 194d generate horizontal components of the applied electric field that determine an inclination direction of the liquid crystal molecules 31. The horizontal components of the electric field are substantially parallel to the sides of the first to fourth fine branched portions 194a, 194b, 194c, and 194d. Therefore, as shown in FIG. 5, the liquid crystal molecules 31 are inclined in a direction that is parallel to a length direction of the fine branched portions 194a, 194b, 194c, and 194d. Since one pixel electrode 191 includes four subregions Da to Dd in which length directions of the fine branched portions 194a, 194b, 194c, and 194d are different from each other, there exist four different directions in which the liquid crystal molecules 31 are inclined. Thus four domains are formed in the liquid crystal layer 3 with four different alignment directions of the liquid crystal molecules 31. As described above, by diversifying the inclination direction of the liquid crystal molecules, the reference viewing angle of the liquid crystal display is increased.

The first sub-pixel electrode 191h and the common electrode 270 form the first liquid crystal capacitor Clch in conjunction with the liquid crystal layer 3 therebetween, and the second sub-pixel electrode 191l and the common electrode 270 form the second liquid crystal capacitor Clcl in conjunction with the liquid crystal layer 3 therebetween, so that the applied voltage is maintained even though the first and second thin film transistors Qh and Ql are turned off.

The first and second sub-pixel electrodes 191h and 191l overlap the sustain electrode 129 and the sustain electrode line 125 to form the first and second sustain capacitors Csth and Cstl, and the first and second sustain capacitors Csth and Cstl strengthen the voltage maintaining ability of the first and second liquid crystal capacitors Clch and Clcl.

The storage expansion electrode 126 and an expansion 177c of the third drain electrode 175c overlap with the gate insulating layer 140 and semiconductor layers 157 and 167 therebetween to form the step-down capacitor Cstd. In another exemplary embodiment, the storage expansion electrode 126 and the expansion 177c of the third drain electrode 175c that constitute the step-down capacitor Cstd may be removed from the semiconductor layers 157 and 167 that are disposed therebetween.

A colored member 320a and a spacer 320b are formed on the upper passivation layer 180q. The colored member 320a is disposed in the region enclosed by the dams 240a disposed in the pixel area.

The colored member 320a is formed by the inkjet printing method by using the dams 240a as partitions. The colored member 320a covers and protects the exposed thin film transistor such that damage to the thin film transistor by external light may be prevented and the height difference with the portion where the light blocking member 220 and the color filter 230 are formed may be compensated.

The spacer 320b to maintain a cell interval between the two display panels 100 and 200 may have a greater height than the colored member 320a and may be formed along with the colored member 320a through the inkjet printing method.

A lower alignment layer (not shown) is formed on the pixel electrode 191, the exposed upper passivation layer 180q, and the colored member 320a and 320b. The lower alignment layer may be a vertical alignment layer.

Next, the upper display panel 200 will be described.

A common electrode 270 is formed on an insulating substrate 210. An upper alignment layer (not shown) is formed on the common electrode 270. The upper alignment layer may be a vertical alignment layer.

A polarizer (not shown) may be provided on the outer surface of the two display panels 100 and 200, and it is preferable that transmissive axes of the two polarizers may be orthogonal to each other and that either transmissive axis is parallel to the gate line 121.

The liquid crystal layer 3 has negative dielectric anisotropy, and the liquid crystal molecules 31 of the liquid crystal layer 3 may be aligned so that long axes thereof are vertical with respect to the surface of two display panels 100 and 200 in the state in which there is no external electric field. Therefore, the incident light does not pass through the crossed polarizers, but is blocked in a state in which there is no externally-applied electric field.

As described above, in this cell, in which the first sub-pixel electrode 191h and the second sub-pixel electrode 191l to which the data voltage is applied generates an electric field in conjunction with the common electrode 270 of the common electrode panel 200, the liquid crystal molecules 31 of the liquid crystal layer 3 lay down to an degree determined by the strength of the horizontal component of the applied electric field. The transmittance of polarized light through the liquid crystal layer 3 changes according to the degree of laying of the liquid crystal molecules 31.

The liquid crystal display according to another exemplary embodiment may further include a cell spacer 320b to maintain the cell interval between the two display panels 100 and 200, and the cell spacer 320b may be simultaneously formed with the same layer as the colored members 320a and 320b.

Figure 7:
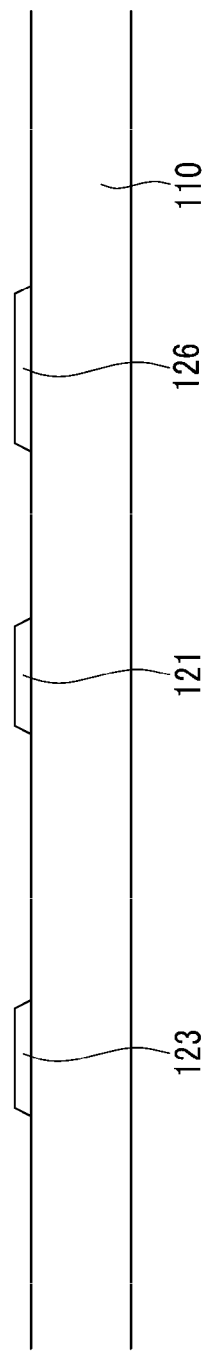
FIG. 7 is a cross-sectional view taken along the line VII-VII of FIG. 6.

Next, a manufacturing method of a thin film transistor array panel according to an exemplary embodiment will be described with reference to FIG. 6 to FIG. 15. FIG. 6, FIG. 8, FIG. 10, and FIG. 13 are layout views sequentially showing steps of a manufacturing method of a thin film transistor array panel according to an exemplary embodiment, FIG. 7 is a cross-sectional view taken along the line VII-VII of FIG. 6. FIG. 9 is a cross-sectional view taken along the line IX-IX of FIG. 8. FIG. 11 is a cross-sectional view taken along the line XI-XI of FIG. 10. FIG. 12A to FIG. 12E are layout views sequentially showing steps of a manufacturing method of the thin film transistor array panel shown in FIG. 10 and FIG. 11. FIG. 14 is a cross-sectional view taken along the line XIV-XIV of FIG. 13. And FIG. 15 is a layout view of the thin film transistor array panel shown in FIG. 13 and FIG. 14.

Referring to FIG. 6 and FIG. 7, a plurality of gate conductors including a plurality of gate lines 121, a plurality of step-down gate lines 123, and a plurality of storage electrode lines 125 are formed on an insulating substrate 110.

Figure 8:
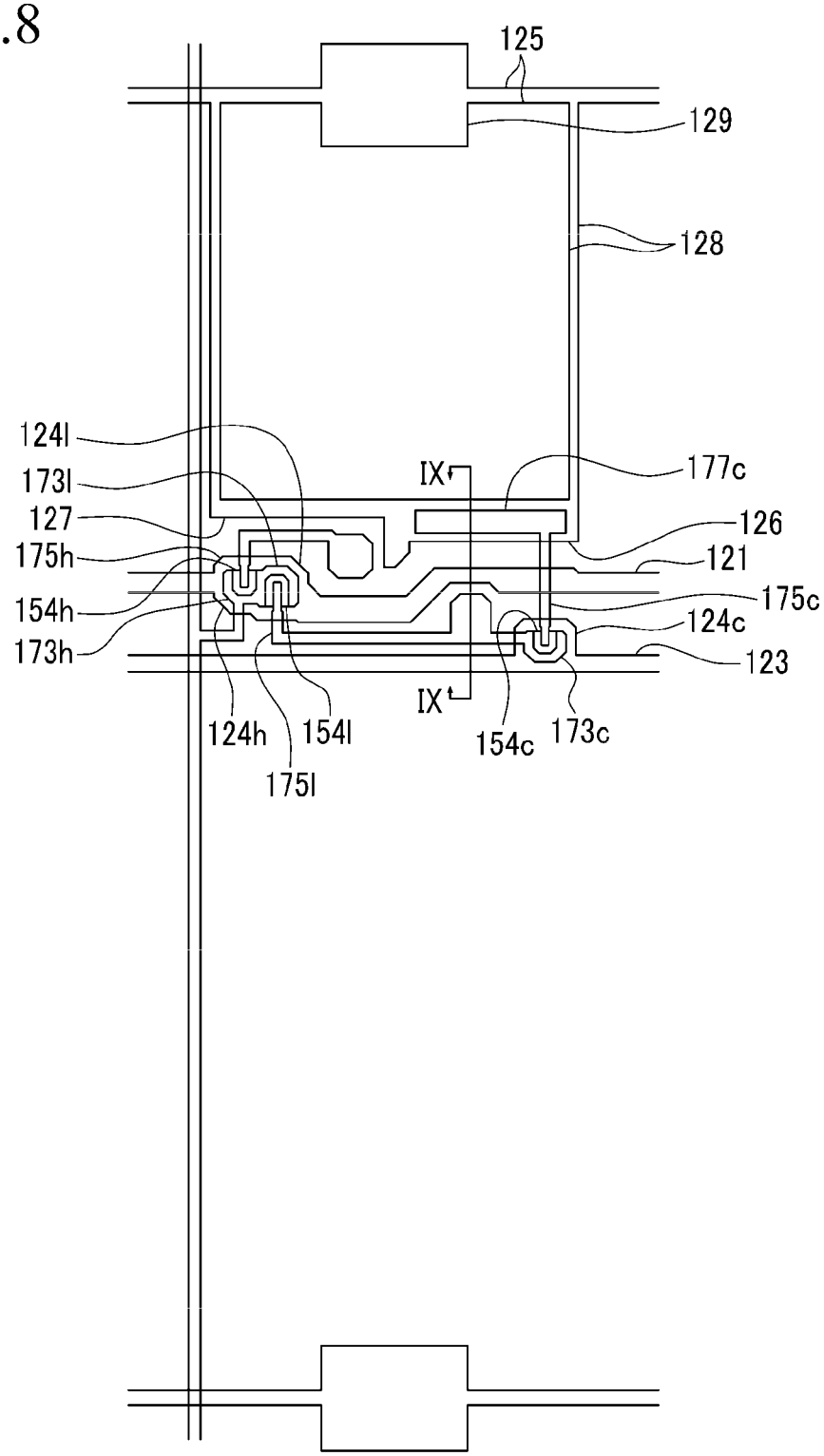
Figure 9:
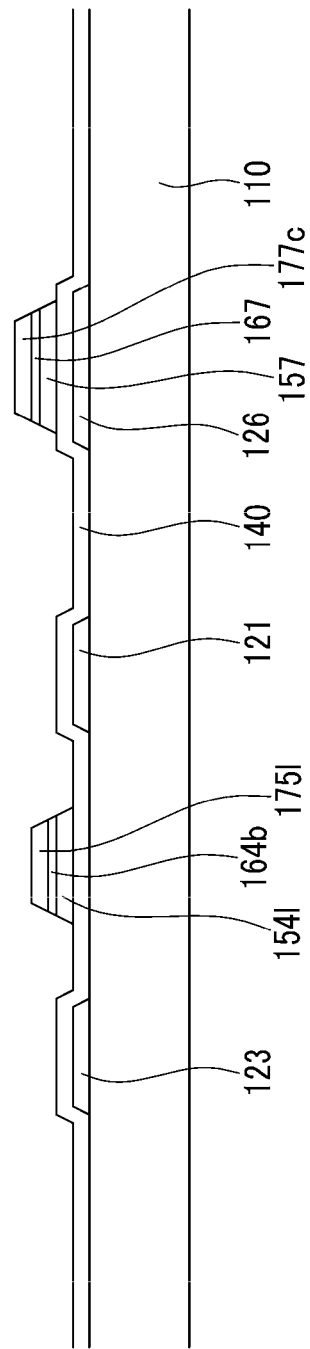
FIG. 9 is a cross-sectional view taken along the line IX-IX of FIG. 8.

Next, referring to FIG. 8 and FIG. 9, a gate insulating layer 140, an intrinsic amorphous silicon layer that is not doped with an impurity, an extrinsic amorphous silicon layer that is doped with an impurity, and a data conductive layer are sequentially formed on the gate conductors 121, 123, and 125. Next, a photosensitive film (not shown) is coated on the data conductive layer, and is exposed and developed by using a slit mask to form a photosensitive pattern having different thicknesses. Next, the data conductive layer, the intrinsic amorphous silicon layer, and the extrinsic amorphous silicon layer are firstly etched by using the photoresist pattern as a mask to form the first and second semiconductors 154h and 154l, the third semiconductor 154c connected to the second semiconductor 154l, and the fourth semiconductor 157, and then the data conductive layer is secondly etched to form a data conductor including a plurality of data lines 171, a plurality of first drain electrodes 175h, a plurality of second drain electrodes 175l, and a plurality of third drain electrodes 175c.

Next, the amorphous silicon layers are etched by using the source electrode and the drain electrode as a mask to form ohmic contacts 164b and 167.

In a manufacturing method of the thin film transistor array panel according to an exemplary embodiment, the data conductors, the semiconductors, and the ohmic contacts may be formed through one photolithography process. A photosensitive film used in this photolithography process has different thicknesses depending on positions, and particularly includes a first portion and a second portion in which the thicknesses are reduced. The first portion is located at a wiring region provided with the data line and the drain electrodes, and the second portion is located at the channel region of the thin film transistor.

There are many methods for forming the difference in thicknesses according to the location of the photosensitive film. One example of the methods includes forming a photomask with a translucent area as well as a light transmitting area and a light blocking area. The translucent area is provided with a slit pattern or a lattice pattern, or as a thin film having medium transmittance or thickness. In the case of utilizing the slit pattern, it is preferable that the slit width or the space between the slits is smaller than the resolution of exposure equipment used in the photolithography process. Another example of the methods includes using a reflowable photosensitive film. That is, the method forms a thin portion by making a photosensitive film flow into a region where the photosensitive film is not present after forming the reflowable photosensitive film with a general exposure mask having only a light transmitting area and a light blocking area.

Since this reduces time for the photolithography process, the manufacturing method is simplified.

Next, a lower passivation layer 180p made of an inorganic insulator such as silicon nitride or silicon oxide is formed on the data conductors 171, 175h, 175l, and 175c and the exposed semiconductors 154h, 154l, and 154c.

Figure 10:
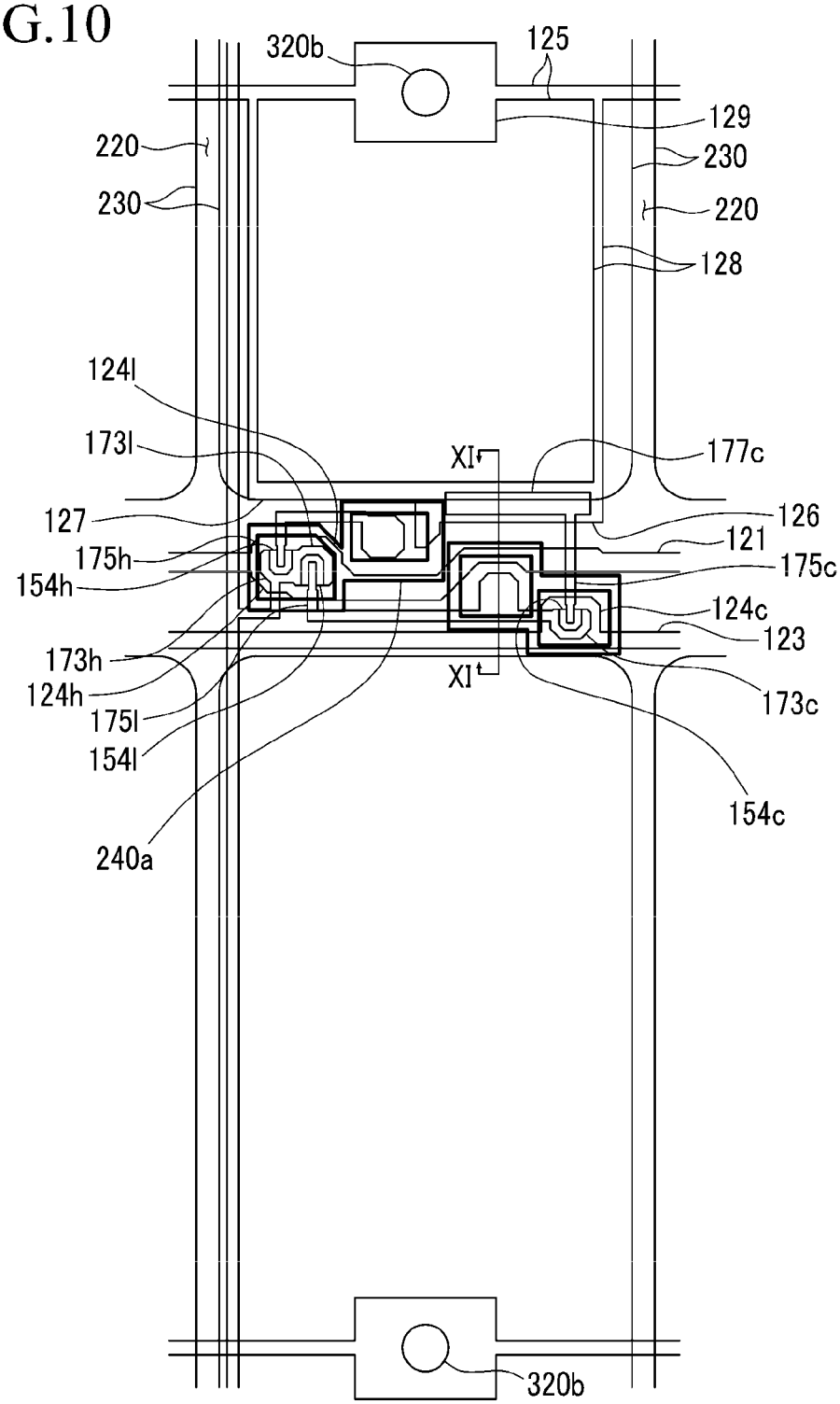
Figure 11:
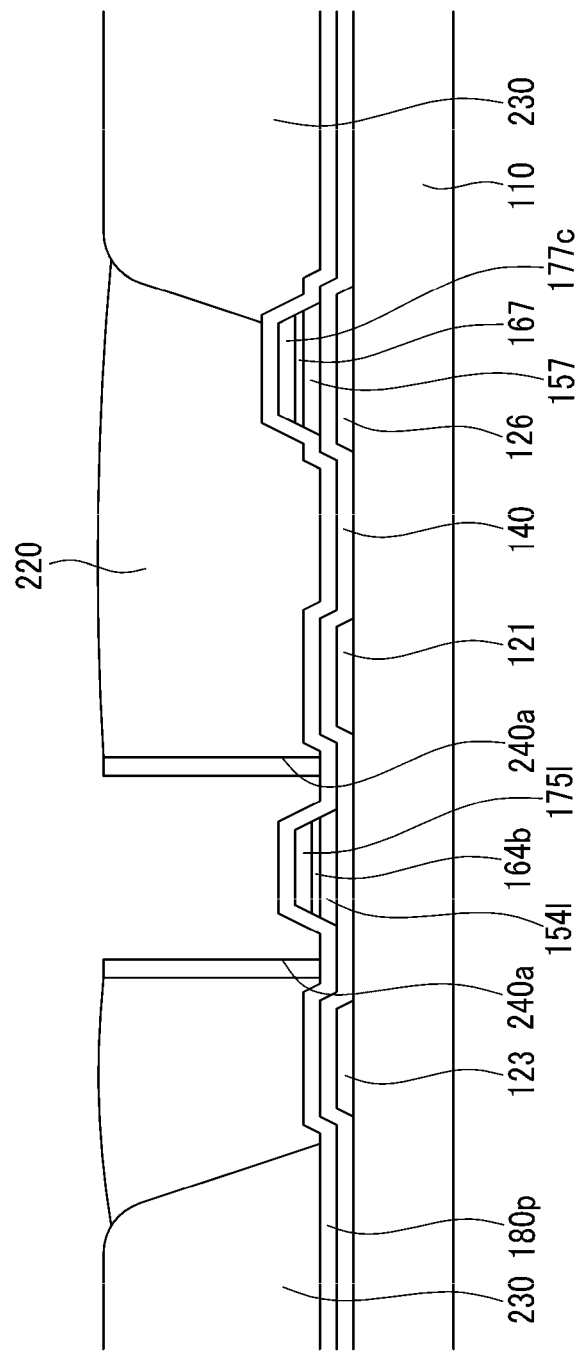
FIG. 11 is a cross-sectional view taken along the line XI-XI of FIG. 10.

Next, referring to FIG. 10 and FIG. 11, a plurality of color filters 230 and a plurality of dams 240a are formed on the lower passivation layer 180p. This will be described in detail with reference to FIG. 12A to FIG. 12E. FIG. 12A to FIG. 12E show a plurality of pixels for better comprehension and ease of description.

Figure 12A:
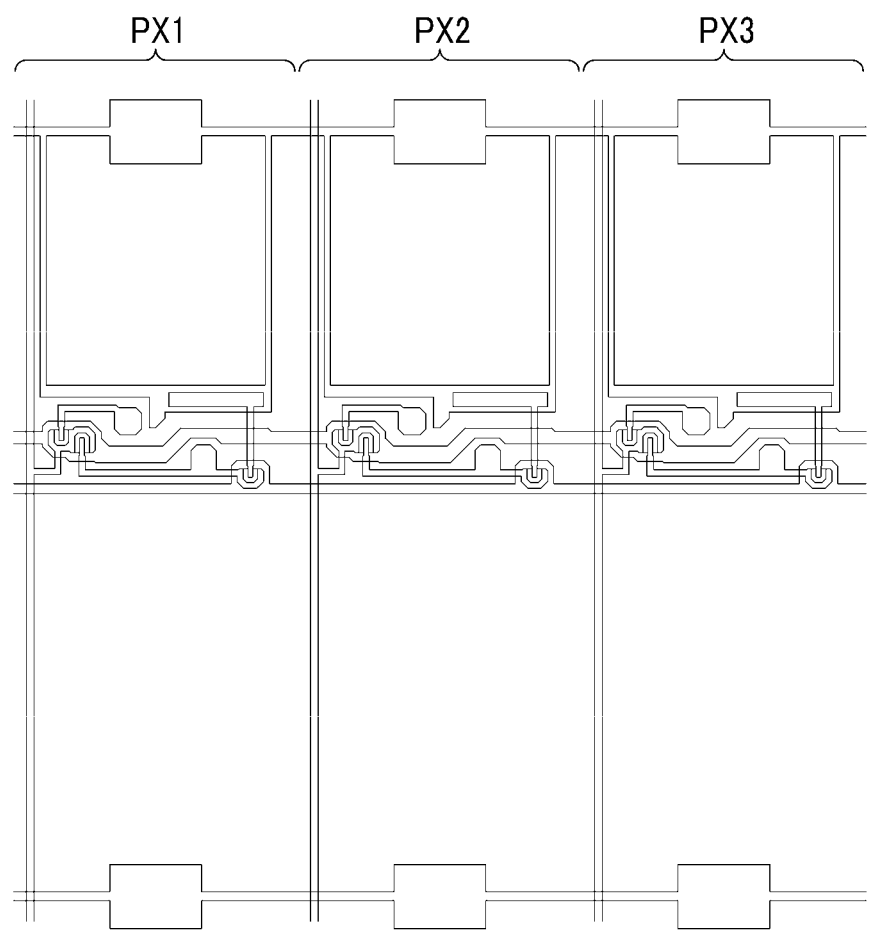
FIG. 12A to FIG. 12E are layout views sequentially showing steps of a manufacturing method of the thin film transistor array panel shown in FIG. 10 and FIG. 11.

Referring to FIG. 12A, the thin film transistor array panel according to the present exemplary embodiment includes a plurality of pixels PX1, PX2, and PX3. Each pixel PX1, PX2, and PX3 has the same structure as that shown in FIG. 8 and FIG. 9.

Figure 12B:
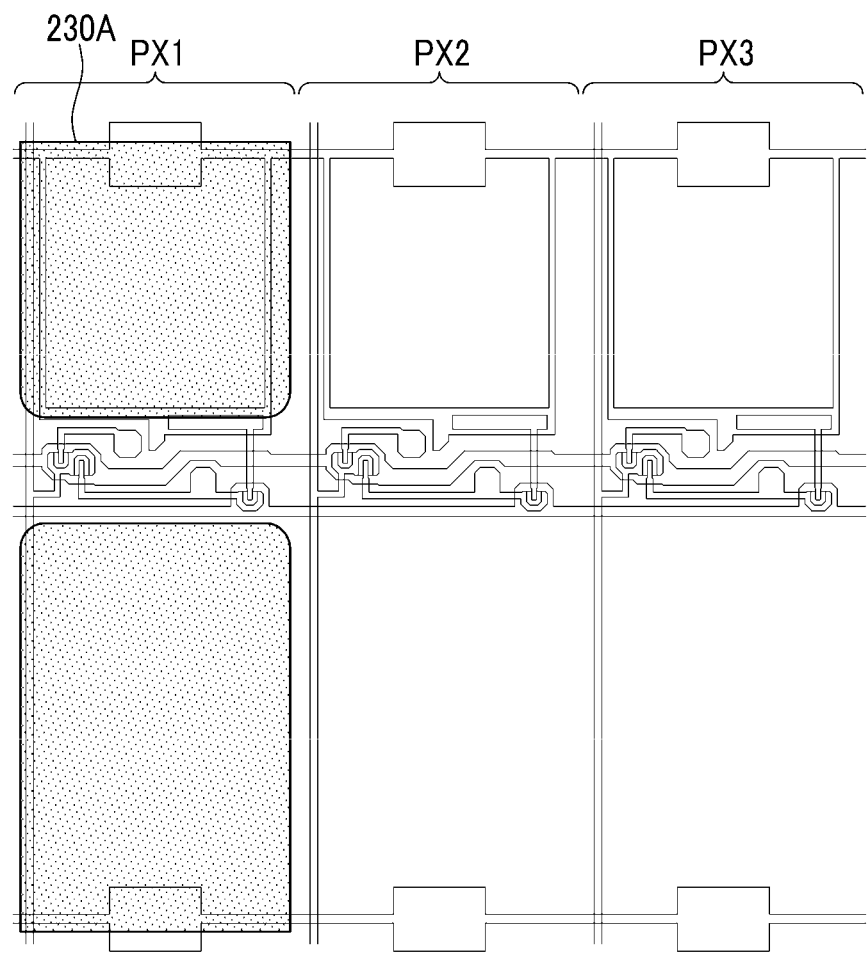

Referring to FIG. 12B, the first color filter 230A is formed in the first pixel PX1 among a plurality of pixels PX1, PX2, and PX3. The first color filter 230a displays the first color and may be formed by exposing and developing a color register.

Figure 12C:
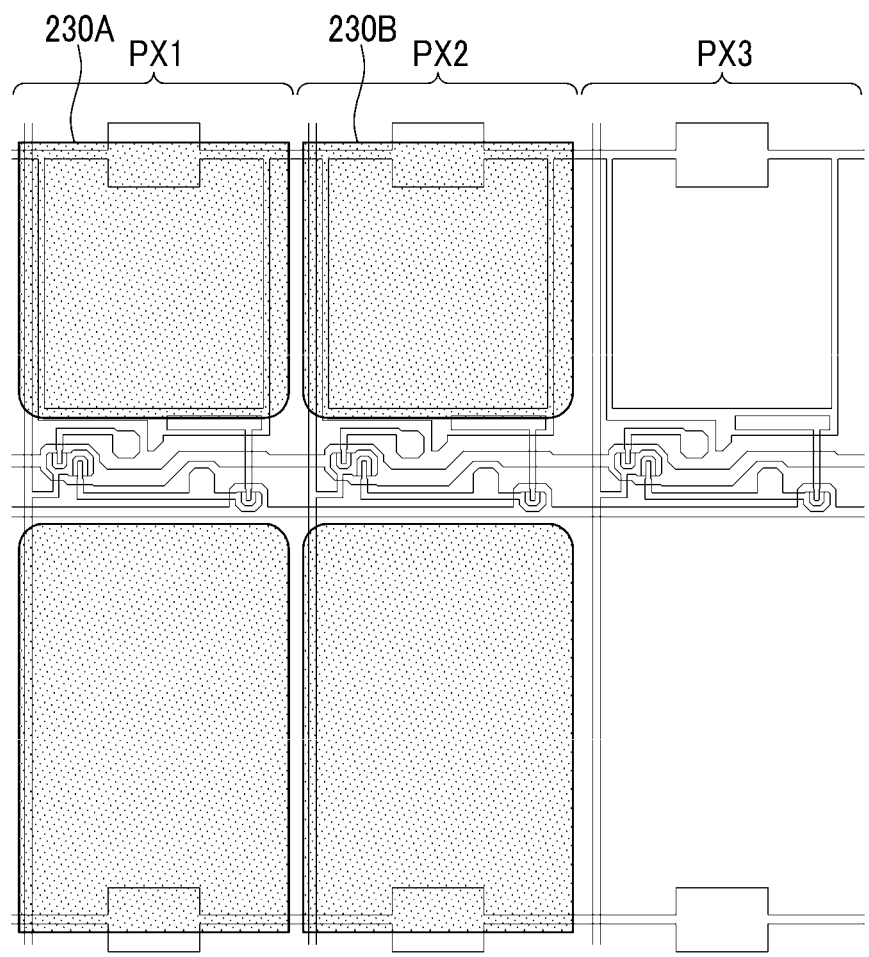

Next, as shown in FIG. 12C, the second color filter 230B is formed in the second pixel PX2 among a plurality of pixels PX1, PX2, and PX3. The second color filter 230B displays the second color and may be formed by exposing and developing a color register.

Figure 12D:
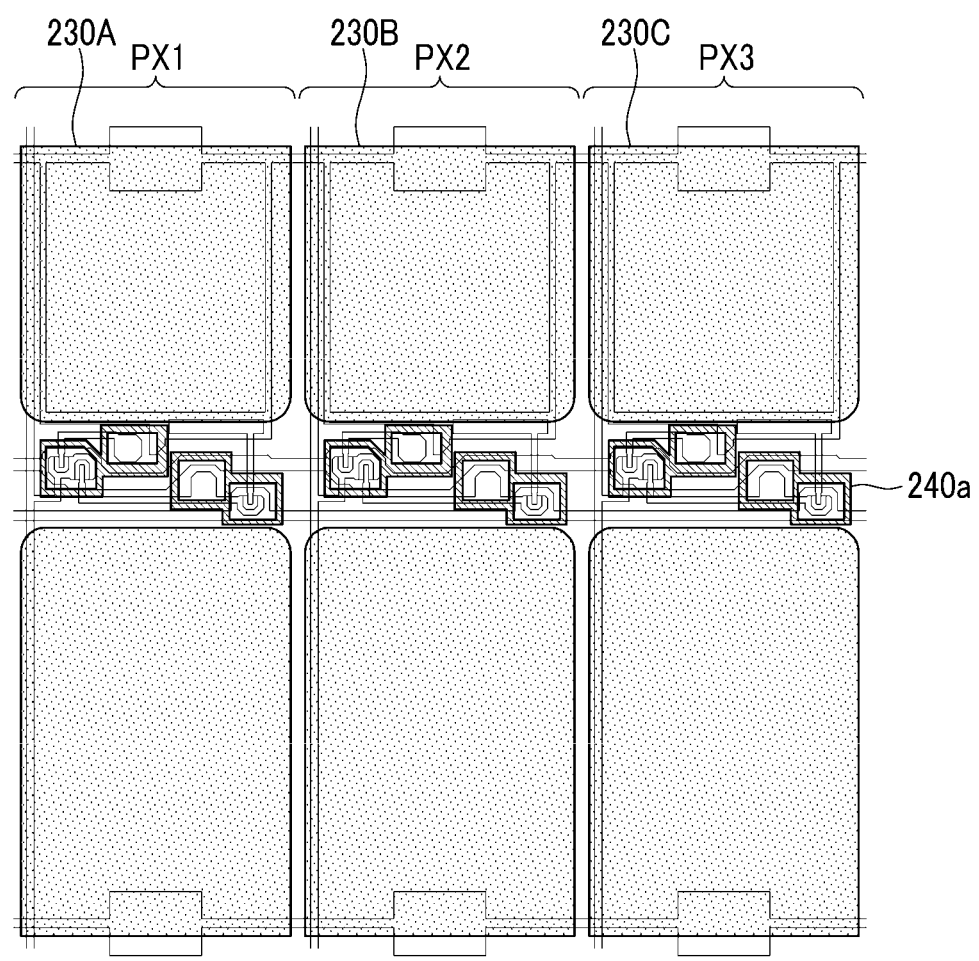

Next, as shown in FIG. 12D, the third color filter 230C is formed in the third pixel PX3 among a plurality of pixels PX1, PX2, and PX3, and simultaneously dams 240a are formed in a plurality of pixels PX1, PX2, and PX3. As shown in FIG. 1, an additional dam may be formed around the display area, and the additional dam may have a shape enclosing the display area.

In the present exemplary embodiment, the dams 240a are formed when forming the third color filter 230C, yet in the manufacturing method according to another different exemplary embodiment, the dams 240a disposed in each pixel PX1, PX2, and PX3 may be respectively formed along with each of the color filters 230A, 230B, and 230C disposed in each pixel PX1, PX2, and PX3.

Here, a material for the color filter 230c and the dams 240a further includes fluorine-based or silicone-based additives to increase an interface hydrophobic characteristic, as well as an original color resist composition. The material for the color filters 230 and the dams 240a includes a pigment dispersion agent, a monomer, a binder, an initiator, and the additives. In the material for the color filter 230c and the dams 240a, the pigment dispersion agent may be in the range of about 30-90 wt %, and more preferably about 60-70 wt %; the monomer may be in the range of about 2-25 wt %, and more preferably about 5-10 wt %; the binder may be in the range of about 2-25 wt %, and more preferably about 5-10 wt %; the initiator may be in the range of about 0.01-1 wt %, and more preferably about 0.05-0.15 wt %; and the additives may be in the range of about 0.01-1 wt %, and more preferably about 0.1-1 wt %.

Examples of the additives may be 1H,1H,2H,2H-perfluorooctyltriethoxysilane, perfluoropentanoic acid, perfluorotetradecanoic acid, perfluorotridecanoic acid, perfluoroundecanoic acid, pefluorooctanoic acid, 1H,1H,2H,2H-perfluoro-1-octanol, perfluorononanoic acid, perfluoroheptanoic acid, 1H,1H,2H,2H-perfluorodecyltriethoxysilane, perfluoroglutaric acid, 1H,1H,2H,2H-perfluoro-1-decanol, and perfluorodecanoic acid.

The color filter 230C and the dams 240a function as a partition for ink for the light blocking member that will be described later to not overflow without a reduction of color reproducibility of the color filter 230, and may have a height of about 1-3 μm, and more preferably about 2-2.5 μm.

Figure 12E:
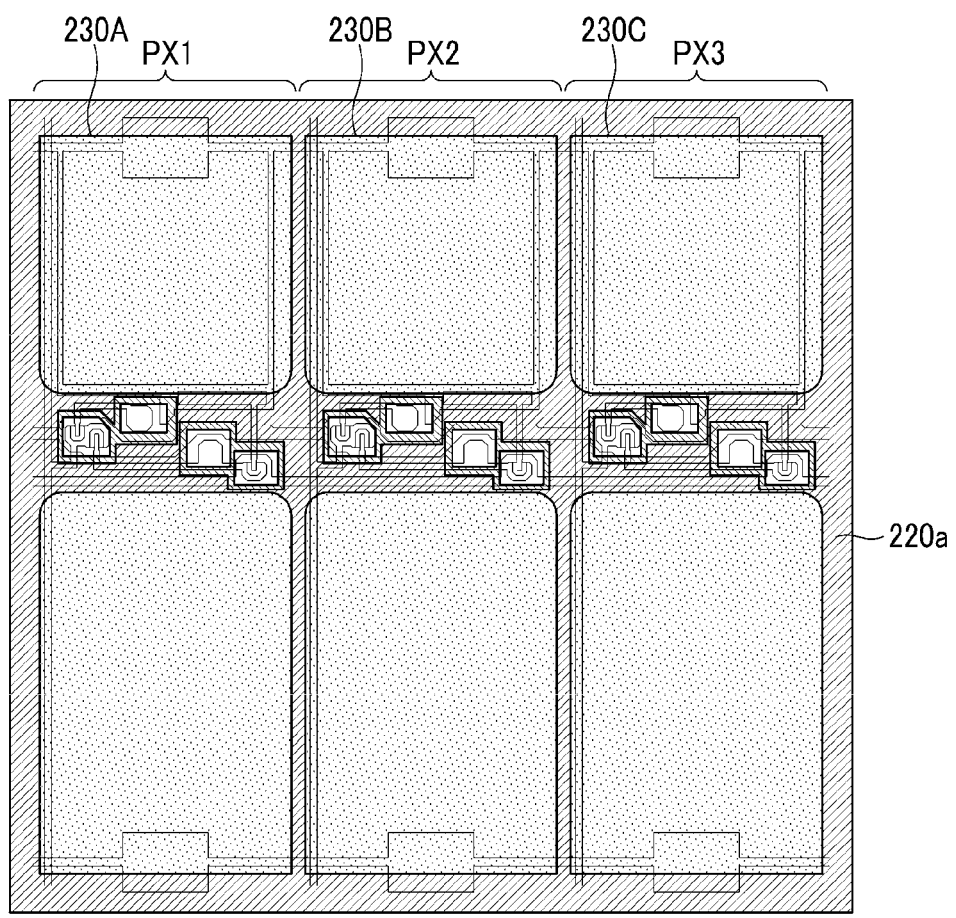

Next, as shown in FIG. 12E, a light blocking member 220 is formed in the region enclosed by the color filters 230A, 230B, and 230C and the dams 240a by using an inkjet printing method. According to an exemplary embodiment of the manufacturing method of the thin film transistor array panel, the ink for the light blocking member 220 includes a black pigment dispersion agent and a solvent having a boiling point of more than about 200 degrees such that the ink for the light blocking member 220 is easily discharged from a printing head of an inkjet printer when forming the light blocking member 220 by the inkjet printing method. In detail, the solvent of the ink for the light blocking member 220 to form the light blocking member 220 may be ethylene glycol n-butyletheracetate (EGBEA), dipropylene glycol monomethyl etheracetate (DPMA), propylene glycol diacetate (PGDA), diethylene glycol monoethylether (DPGME), diethylene glycol monoethylether (carbitol). Also, the ink for the light blocking member 220 including the binder and the light blocking member 220 of the thin film transistor according to an exemplary embodiment is formed through the inkjet printing method such that there is no problem such as a side taper angle, etc. Accordingly, the ink for the light blocking member 220 may include an acrylate-based binder. One example of the acrylate-based binder is as follows.

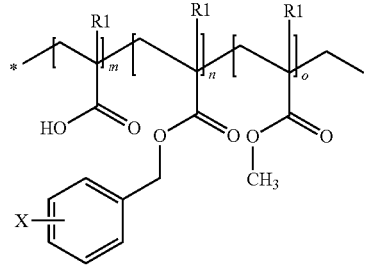

m, n, o: an integer of 0-10,000
R1: H, CH3
X: hydrogen, alkyl, alkoxy, nitro, halogen On the other hand, if a line width (a critical dimension) of the light blocking member 220 is very small, a drip amount of the ink for the light blocking member 220 is small such that accuracy may be deteriorated under the inkjet printing method. If the line width is very large, however, the aperture ratio of the liquid crystal display may be reduced. Accordingly, the line width of the light blocking member 220 of the thin film transistor array panel according to an exemplary embodiment may be in the range of about 3-10 μm, and more preferably about 4-5 μm, and thereby the aperture ratio of the display device may not be reduced while the accuracy is not reduced under the inkjet printing method.

In this way, the color filters 230, the dams 240a, and the light blocking member 220 are formed.

Figure 13:
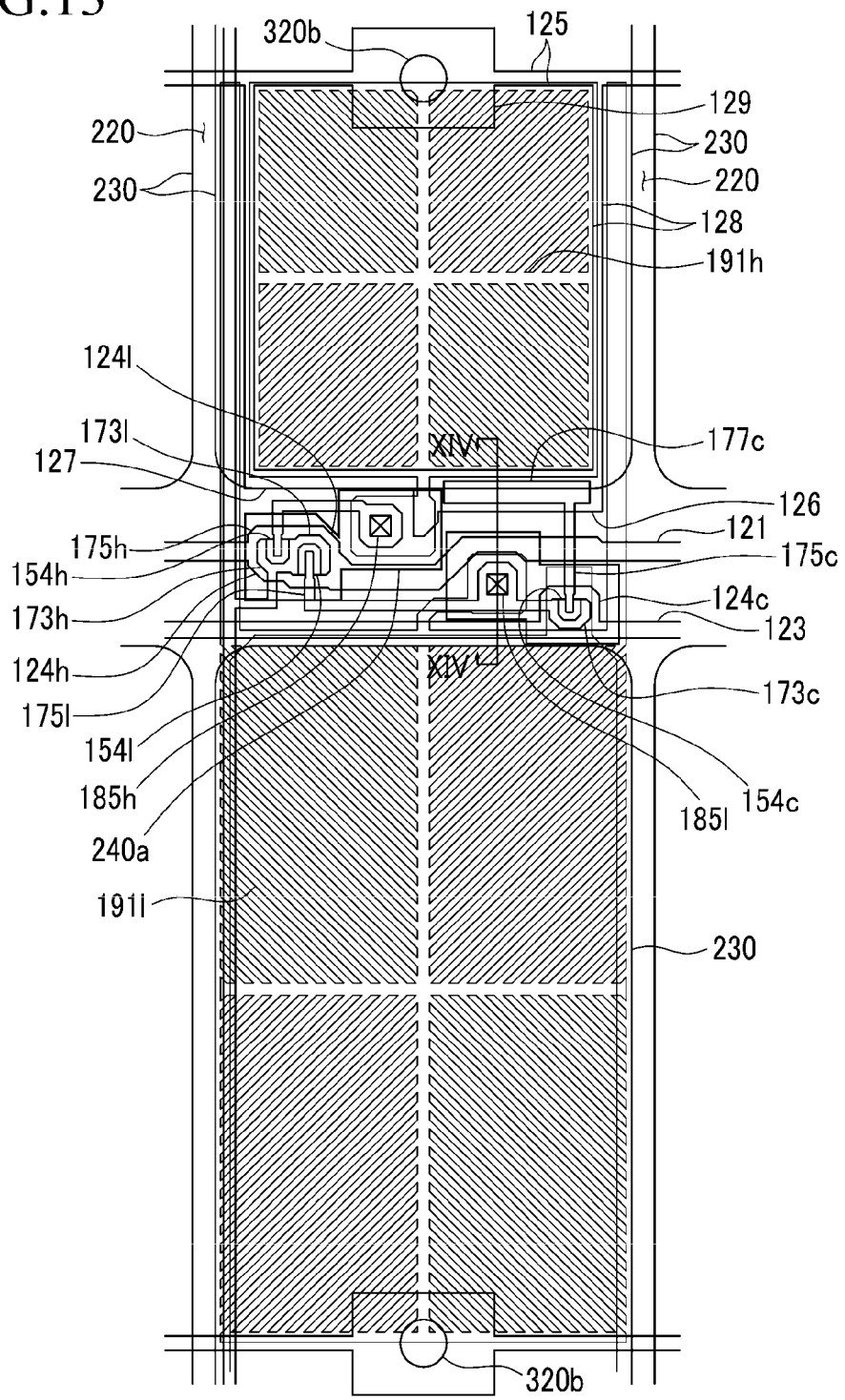
Figure 14:
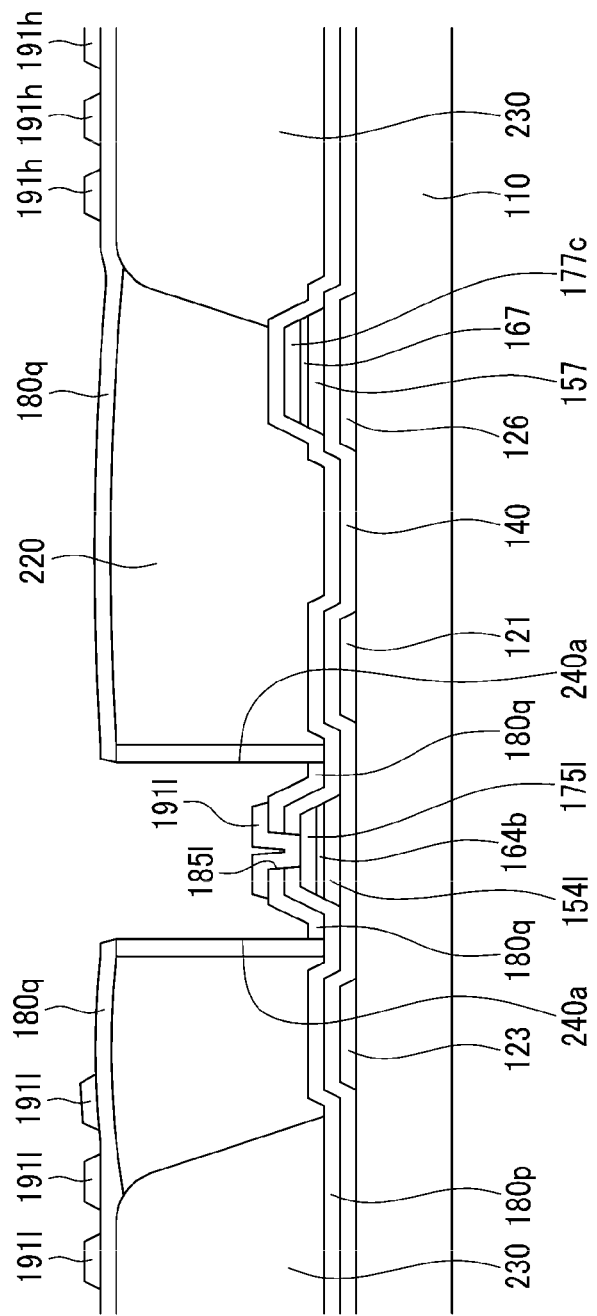
FIG. 14 is a cross-sectional view taken along the line XIV-XIV of FIG. 13.
Figure 15:
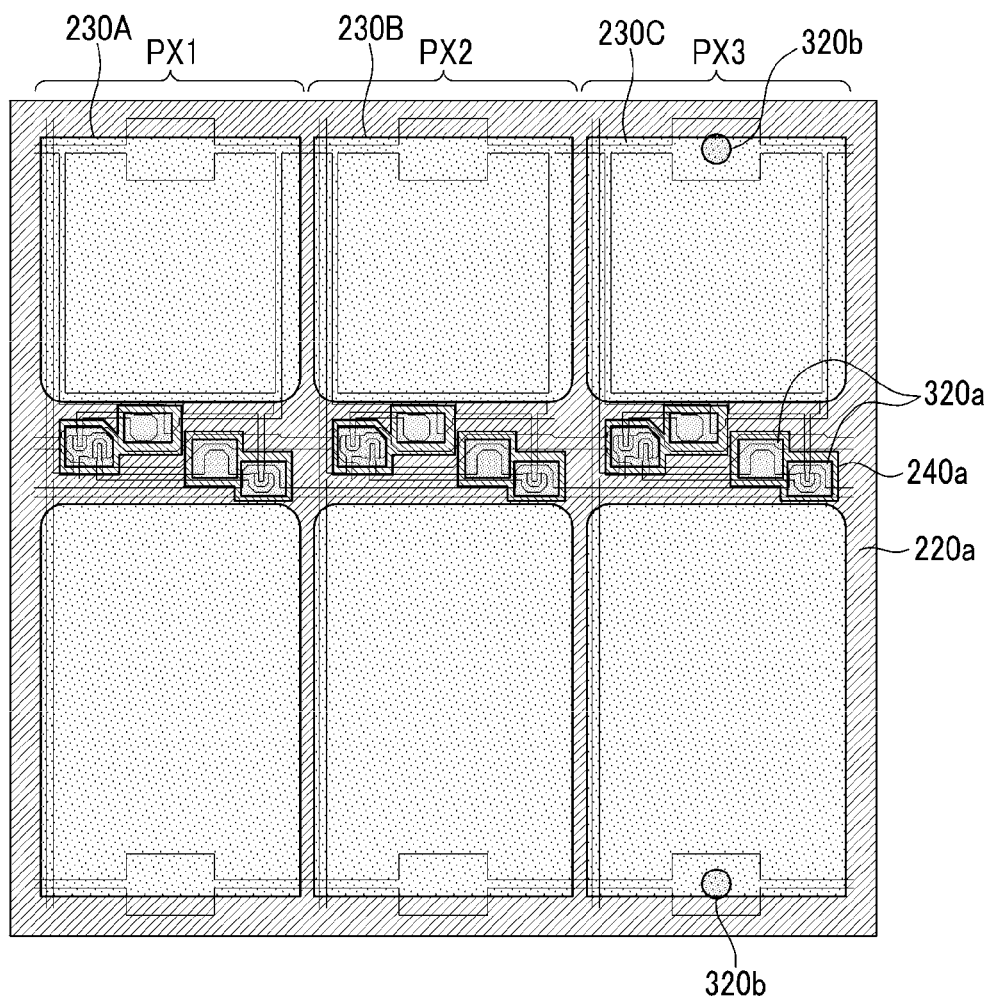
FIG. 15 is a layout view of the thin film transistor array panel shown in FIG. 13 and FIG. 14.

Next, as shown in FIG. 13 and FIG. 14, an upper passivation layer 180q is formed on the color filter 230 and the light blocking member 220, and the lower passivation layer 180p and the passivation layer 180q are patterned to form a plurality of the first contact holes 185h exposing the wide end of the first drain electrode 175 and a plurality of the second contact holes 185l exposing the wide end of the second drain electrode 175l. Next, a plurality of pixel electrodes 191 is formed on the upper passivation layer 180q. Here, a defect of the thin film transistor electrically connected to the pixel electrode 191 may be inspected and repaired. The dams 240a of the thin film transistor according to an exemplary embodiment exposes the thin film transistor such that the thin film transistor is not covered by the light blocking member 220, and thereby the repair of the defect is easy.

Next, as shown in FIG. 3, FIG. 4, and FIG. 15, a colored member 320a and a spacer 320b are formed on the upper passivation layer 180q by using the inkjet printing method. The colored member 320a is disposed in the region enclosed by the dams 240a disposed in the pixel area, and thereby the colored member 320a is formed by the inkjet printing method by using the dams 240a as partitions. The spacers 320b to maintain a cell interval between two display panels 100 and 200 may have a higher height than the colored member 320a, and may be formed along with the colored member 320a through the inkjet printing method.

As described above, in the thin film transistor array panel according to an exemplary embodiment, the dams having the function to form the light blocking member by the inkjet printing method are formed along with the color filters, and after forming the light blocking member by the inkjet printing method, the spacers are formed by the inkjet printing method along with the colored member, and thereby the alignment error of the light blocking member and the color filter may be reduced, the manufacturing cost is low, and the manufacturing method is simplified.

While this invention has been described in connection with what are presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A thin film transistor array panel comprising:
an insulating substrate;
a plurality of thin film transistors disposed on the insulating substrate;
a plurality of color filters and a plurality of dams disposed on the insulating substrate, the plurality of dams being spaced apart from the plurality of color filters; and
a light blocking member disposed in a region between the plurality of color filters and the plurality of dams,
wherein the plurality of dams expose at least a portion of a plurality of thin film transistors.

2. The thin film transistor array panel of claim 1, further comprising a plurality of colored members disposed in regions enclosed by the plurality of dams.

3. The thin film transistor array panel of claim 2, further comprising a spacer made with the same layer as the plurality of colored members.

4. The thin film transistor array panel of claim 3, wherein the plurality of colored members and the spacer are formed by an inkjet printing method.

5. The thin film transistor array panel of claim 2, wherein the plurality of colored members are formed by the inkjet printing method using the dams as partitions.

6. The thin film transistor array panel of claim 1, wherein the thin film transistor array panel includes a display area formed with a plurality of pixels and a peripheral area around the display area, and an additional dam disposed in the peripheral area is further included.

7. The thin film transistor array panel of claim 1, wherein the plurality of dams are formed with the same layer as at least one of the plurality of color filters.

8. The thin film transistor array panel of claim 7, wherein the plurality of dams include fluorine-based or silicone-based additives.

9. The thin film transistor array panel of claim 8, wherein the additives include one of 1H, 1H, 2H, 2H-perfluorooctyltriethoxysilane, perfluoropentanoic acid, perfluorotetradecanoic acid, perfluorotridecanoic acid, perfluoroundecanoic acid, pefluorooctanoic acid, 1H, 1H, 2H, 2H-perfluoro-1-octanol, perfluorononanoic acid, perfluoroheptanoic acid, 1H, 1H, 2H, 2H-perfluorodecyltriethoxysilane, perfluoroglutaric acid, 1H, 1H, 2H, 2H-perfluoro-1-decanol, and perfluorodecanoic acid.

10. The thin film transistor array panel of claim 9, wherein the plurality of dams further include a pigment dispersion agent, a monomer, a binder, and an initiator.

11. The thin film transistor array panel of claim 1, wherein a height due to the plurality of color filters and the plurality of dams is about 1 μm to about 3 μm.

12. The thin film transistor array panel of claim 11, wherein the height due to the plurality of color filters and the plurality of dams is about 2 μm to about 2.5 μm.

13. The thin film transistor array panel of claim 1, wherein the light blocking member includes a pigment dispersion agent and a solvent material, and the solvent material has a boiling point of more than about 200 degrees.

14. The thin film transistor array panel of claim 13, wherein the solvent material includes one of ethylene glycol n-butyletheracetate (EGBEA), dipropylene glycol monomethyl etheracetate (DPMA), propylene glycol diacetate (PGDA), diethylene glycol monoethylether (DPGME), and diethylene glycol monoethylether (carbitol).

15. The thin film transistor array panel of claim 14, wherein the light blocking member further includes a binder, and the binder is acrylate-based.

16. The thin film transistor array panel of claim 15, wherein the binder is represented by a chemical formula

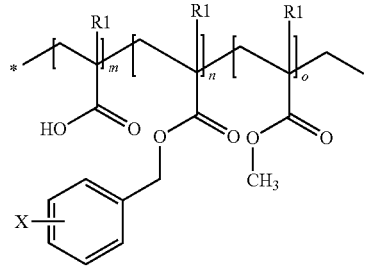

where m, n, and o are integers of 0-10,000,
R1 is H or CH3, and
X is hydrogen, an alkyl, an alkoxy, a nitro, or a halogen.

17. The thin film transistor array panel of claim 1, wherein a line width of the light blocking member is in the range of about 3 μm to about 10 μm.

18. The thin film transistor array panel of claim 17, wherein the line width of the light blocking member is in the range of about 4 μm to about 5 μm.

19. A method of manufacturing a thin film transistor array panel, comprising:
    forming a plurality of thin film transistors on an insulating substrate;
    forming a plurality of color filters and a plurality of dams on the insulating substrate, the plurality of dams being spaced apart from the plurality of color filters; and
    forming a light blocking member in a region between the plurality of color filters and the plurality of dams through an inkjet printing method,
    wherein the plurality of dams expose at least a portion of the plurality of thin film transistors.

20. The method of claim 19, further comprising forming a plurality of colored members in regions enclosed by the plurality of dams.

21. The method of claim 20, further comprising forming a spacer made with the same layer as the plurality of colored members in forming of the plurality of colored members.

22. The method of claim 21, wherein the plurality of colored members and the spacer are formed by an inkjet printing method.

23. The method of claim 20, wherein the plurality of colored members are formed by an inkjet printing method using the dams as partitions.

24. The method of claim 19, wherein the thin film transistor array panel includes a display area formed with a plurality of pixels and a peripheral area around the display area, and the dams disposed in the peripheral area are formed in forming of the plurality of color filters and the plurality of dams.

25. The method of claim 19, wherein the plurality of dams are formed with the same layer as at least one of the plurality of color filters.

26. The method of claim 25, wherein the plurality of dams include fluorine-based or silicone-based additives.

27. The method of claim 26, wherein the additives includes one of 1H, 1H, 2H, 2H-perfluorooctyltriethoxysilane, perfluoropentanoic acid, perfluorotetradecanoic acid, perfluorotridecanoic acid, perfluoroundecanoic acid, pefluorooctanoic acid, 1H, 1H, 2H, 2H-perfluoro-1-octanol, perfluorononanoic acid, perfluoroheptanoic acid, 1H, 1H, 2H, 2H-perfluorodecyltriethoxysilane, perfluoroglutaric acid, 1H, 1H, 2H, 2H-perfluoro-1-decanol, and perfluorodecanoic acid.

28. The method of claim 27, wherein the plurality of dams further include a pigment dispersion agent, a monomer, a binder, and an initiator.

29. The method of claim 19, wherein a height due to a plurality of color filter and a plurality of dams is about 1 μm to about 3 μm.

30. The method of claim 29, wherein the height due to the plurality of color filters and the plurality of dams is about 2 μm to about 2.5 μm.

31. The method of claim 19, wherein ink for an inkjet printing in forming of the light blocking member includes a pigment dispersion agent and a solvent material, and the solvent material has a boiling point of more than about 200 degrees.

32. The method of claim 31, wherein the solvent material includes one of ethylene glycol n-butyletheracetate (EGBEA), dipropylene glycol monomethyl etheracetate (DPMA), propylene glycol diacetate (PGDA), diethylene glycol monoethylether (DPGME), and diethylene glycol monoethylether (carbitol).

33. The method of claim 32, wherein the ink for the inkjet printing further includes a binder, and the binder is acrylate-based.

34. The method of claim 33, wherein the binder is

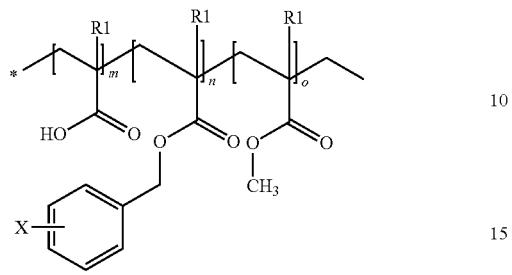

where m, n, and o are integers of 0-10,000,
R1 is H or CH3, and
X is hydrogen, an alkyl, an alkoxy, a nitro, or a halogen.

35. The method of claim 19, wherein a line width of the light blocking member is in the range of about 3 μm to about 10 μm.

36. The method of claim 35, wherein the line width of the light blocking member is in the range of about 4 μm to about 5 μm.

* * * * *